United States Patent
Hoshino et al.

[11] Patent Number: 6,117,713
[45] Date of Patent: Sep. 12, 2000

[54] METHOD OF PRODUCING A MESFET SEMICONDUCTOR DEVICE HAVING A RECESSED GATE STRUCTURE

[75] Inventors: Koichi Hoshino, Obu; Tetsuya Katayama, Aichi-gun, both of Japan

[73] Assignee: Denso Corporation, Kariya, Japan

[21] Appl. No.: 09/019,163

[22] Filed: Feb. 6, 1998

[30] Foreign Application Priority Data

Feb. 12, 1997 [JP] Japan .................................. 9-044771

[51] Int. Cl.[7] ................................................. H01L 21/338
[52] U.S. Cl. .................... 438/172; 438/180; 438/571; 438/577
[58] Field of Search .................. 438/167, 180, 438/172, 571, 577

[56] References Cited

U.S. PATENT DOCUMENTS

| 5,231,040 | 7/1993 | Shimura . | |
|---|---|---|---|
| 5,362,677 | 11/1994 | Sakamoto et al. | 438/167 |
| 5,770,489 | 6/1998 | Onda | 438/167 |
| 5,869,364 | 2/1999 | Nakano et al. | 438/167 |
| 5,888,859 | 3/1999 | Oku et al. | 438/174 |

FOREIGN PATENT DOCUMENTS

| 2-140942 | 5/1990 | Japan . |
|---|---|---|
| 2-191344 | 7/1990 | Japan . |
| 2-191345 | 7/1990 | Japan . |

OTHER PUBLICATIONS

"Double–Recess Lattice–Matched Heat" H. Kawasaki et al, pp. 2–312, an autumn conference of the electronic society, No Date.

*Primary Examiner*—Olik Chaudhuri
*Assistant Examiner*—Kurt Eaton
*Attorney, Agent, or Firm*—Pillsbury Madison & Sutro LLP

[57] ABSTRACT

An insulating layer is formed on a semiconductor substrate, and a first resist layer having a first resist opening portion is formed on the insulating layer. Then, the insulating layer is etched thought the opening portion to expose the substrate. After removing the first resist layer, a second resist layer having second resist opening portions are formed. One of the second resist opening portions is provided to expose the substrate, and a recess is formed in the substrate through the opening portion. Further, the insulating layer exposed from the other of the second resist opening portions is removed. Then, an electrode member for gate, source, and drain electrodes is deposited on the substrate. As a result, variations in intervals between the gate and drain electrodes and between the gate and source electrodes can be reduced.

19 Claims, 11 Drawing Sheets

METHOD OF PRODUCING A MESFET SEMICONDUCTOR DEVICE HAVING A RECESSED GATE STRUCTURE

CROSS REFERENCE TO RELATED APPLICATION

This application is based upon and claims the benefit of priority of the prior Japanese Patent Application No. 9-44771 filed on Feb. 12, 1997, the contents of which are incorporated herein by reference.

BACKGROUND OF THE INVENTION

1. Field of the Invention

The present invention relates to a method for producing a Schottky junction field effect transistor (i. e., metal semiconductor field effect transistor, herebelow referred to as MESFET) having a recess gate structure. The method is adopted to semiconductor processes for a high electron mobility transistor (herebelow referred to as HEMT) or the like that is operated at high frequency.

2. Related Arts

A MESFET generally includes source and drain electrodes making an ohmic contact with a semiconductor layer and a gate electrode disposed between the source and drain electrodes and making a Schottky contact with the semiconductor layer. A drain current in the MESFET is controlled by a field effect of the gate electrode. The MESFET can be used as a high frequency semiconductor element by adopting material such as GaAs having a high mobility for the semiconductor layer. Further, recently, a HEMT capable of being operated at higher frequency has been studied and developed. The HEMT includes a semiconductor hetero junction to have a doped layer for producing carriers therein and a channel layer separated from the doped layer for transferring the carriers therethrough, realizing high frequency operation.

In these field effect transistors (FET), a recess gate structure is widely employed as a structure of the gate electrode making a Schottky contact. When this kind of FET having the recess gate structure is manufactured, as shown in FIG. 1, an ohmic contact layer 70a having a high doping concentration is formed in a surface region of a semiconductor substrate 70, and source and drain electrodes 71 and 72 are disposed on the ohmic contact layer 70a. Further, as shown in FIG. 2, a photo-resist layer 73 is disposed on the substrate 70 to have a specific pattern. Then, a part of the ohmic contact layer 70a where a gate electrode 76 (see FIG. 5) is to be formed is removed by etching using the resist layer 73 as a mask. Accordingly, a recess 74 is formed as shown in FIG. 3. Successively, as shown in FIG. 4, an electrode member 75 is deposited on the photo-resist layer 73 and in the recess 74. Then, as shown in FIG. 5, the gate electrode 76 is formed by performing a metal lift-off process with respect to the electrode member 75. Finally, as shown in FIG. 6, an insulating layer 77, a source wiring member 78, and a drain wiring member 79 are formed.

Advantageous of the above-mentioned recess gate structure are that contact resistances of the gate, source, and drain electrodes, 76, 71, and 72 can be reduced and that intervals between both ends of the gate electrode 76 and the ohmic contact layer 70a can be narrowed by self-alignment. Consequently, a source resistance and variations in the source resistance can be reduced.

However, in the above-mentioned method, the gate electrode 76 is formed by using the resist layer 73, and the source and drain electrodes 71 and 72 are formed by using another resist layer. Therefore, this method is liable to produce alignment deviation of the gate electrode 76 with respect to the source and drain electrodes 71 and 72. That is, it is difficult to secure specific intervals L10 and L20 (see FIG. 6) between the gate and source electrodes 76 and 71 and between the gate and drain electrodes 76 and 72.

To solve the problem, JP-A-2-285644 discloses a technique for arranging a gate electrode in a recess gate structure with a high accuracy. Specifically, when a T-type Schottky gate electrode is arranged with respect to source and drain electrodes, three types of insulating layers are used. More specifically, an L-type and a reverse L-type insulating layers are formed by utilizing side walls of another layer. Then, the gate electrode is positioned with respect to the source and drain electrodes by using the insulating layers to provide relatively small intervals with respect to the source and drain electrodes. However, this technique needs formation processes for the three types of insulating layers and etching processes for the layers. Additionally, it is necessary to perform complicated processes such as an ion milling process for the gate electrode. As a result, manufacturing cost is increased.

On the other hand, recently, various semiconductor materials have been studied to improve operation frequency of an FET. For example, a HEMT structure having a hetero junction of an InAlAs doped layer and an InGaAs channel layer is proposed to achieve a significantly high mobility. In this structure, however, a gate electrode needs to be formed on the InAlAs layer. It is difficult for the gate electrode to exhibit sufficient Schottky characteristics on the InAlAs layer. In addition, when the HEMT structure includes the above-mentioned recess gate structure, it is difficult to obtain a sufficient drain withstand voltage.

As a technique to solve this problem, a double recess structure is proposed in, for example, "DOUBLE-RECESS LATTICE-MATCHED MEMT", an autumn conference of the electronic information communication society, 1991, pp. 2–312, by Hisao Kawasaki et al. A method for producing an FET having the double recess structure is as follows. Firstly, as shown in FIG. 7, source and drain electrodes 81 and 82 are disposed on a substrate 80. Then, as shown in FIG. 8, a first recess 84 is formed in the substrate 80 between the source and drain electrodes 81 and 82 by an etching process using a first resist layer 83 as a mask. After forming the first recess 84, the first resist layer 83 is removed. Then, as shown in FIG. 9, a second resist layer 85 is formed on a bottom face of the recess 84 as well as on the source and drain electrodes 81 and 82, and a second recess 86 is formed by an etching process using the second resist layer 85 as a mask as shown in FIG. 10. Further, as shown in FIG. 11, an electrode member 87 is deposited on a bottom face of the second recess 86 and on the resist layer 85. Then, in a state where only a gate electrode 88 remains in the recess 86 as shown in FIG. 12, an insulating layer 89, a source wiring member 90, and a drain wiring member 91 are formed as shown in FIG. 13.

Thus, in the method for forming the double recess structure, because the mask 85 for forming the gate electrode 88 is different from the mask 83 for forming the first recess 84, a width of the first recess 84 can be lengthened regardless of a width of the gate electrode 88. As a result, a drain withstand voltage of the FET can be improved.

However, this method has the following problem. That is, in the single recess structure shown in FIG. 6, intervals between the gate electrode 76 and the ohmic contact layer 70*a* can be set by self-alignment. As opposed to this, in the double recess structure shown in FIG. 13, intervals L12 and L13 between the gate electrode 88 and an ohmic contact layer 80*a* are liable to have variations due to a deviation in mask alignment. The variations in intervals L12 and L13 cause variations in source resistance, variations in drain withstand voltage and the like. The variations in the source resistance further cause variations in high frequency parameter. As a result, various problems occur in a high frequency circuit using the FET.

In this way, although the double recess structure is effective for HEMT and MESFET to improve the drain withstand voltages thereof, the variations in the intervals L12 and L13 between the gate electrode 88 and the ohmic contact layer 80*a* in the double recess structure cause the above-mentioned problems. The variations in the intervals L12 and L13 are produced by the deviation in the mask alignment between the first recess 84 and the gate electrode 88. Therefore, it is necessary that alignment of the gate electrode 88 is precisely performed with respect to the first recess pattern to decrease the variations in the intervals L12 and L13. However, a depth of the first recess 84 shown in FIG. 8 is too shallow to be detected through the resist layer 85 shown in FIG. 9. Because of this, conventionally, the first recess 84 is aligned with respect to a reference pattern as shown in FIG. 8, and then, the gate electrode 88 is aligned with respect to another reference pattern as shown in FIG. 9.

Consequently, an amount of the deviation in the mask alignment between the first recess 84 and the gate electrode 88 is the sum of amounts of deviations in mask alignment of the first recess 84 with respect to the reference pattern and of the gate electrode 88 with respect to the another reference pattern. As a result, the amount of the deviation in the mask alignment between the first recess 84 and the gate electrode 88 becomes large.

SUMMARY OF THE INVENTION

The present invention has been made in view of the above-mentioned problems and an object of the present invention is to provide a method for producing a semiconductor device having a recess gate structure with constant intervals between gate and source electrodes and between gate and drain electrodes by simple processes. Another object of the present invention is to provide a method capable of reducing a deviation in mask alignment when producing a semiconductor device having a recess gate structure.

According to a method of the present invention, firstly, an insulating layer is formed on a semiconductor substrate, and a first opening portion is formed in the insulating layer to expose the semiconductor substrate therefrom. Then, a resist layer is formed on the insulating layer to have resist opening portions. One of the resist opening portions is formed in the first opening portion of the insulating layer and exposes the semiconductor substrate therefrom. The other of the resist opening portions expose the insulating layer therefrom. In this state, a main recess is formed in the semiconductor substrate through the one of the resist opening portions, and the insulating layer exposed from the other of the resist opening portions is removed. Then, gate, source, and drain electrodes are formed on the semiconductor substrate. A secondary recess may be formed in the semiconductor substrate through the first opening portion of the insulating layer. In this case, the main recess is formed in the secondary recess.

In this method, the gate, source, and drain electrodes can be formed with the same mask. Therefore, constant intervals between the gate and source electrodes and between the gate and drain electrodes can be secured.

BRIEF DESCRIPTION OF THE DRAWINGS

These and other objects and features of the present invention will become more readily apparent from a better understanding of the preferred embodiments described below with reference to the following drawings.

DETAILED DESCRIPTION OF THE PREFERRED EMBODIMENTS (First Embodiment)

Figure 20:
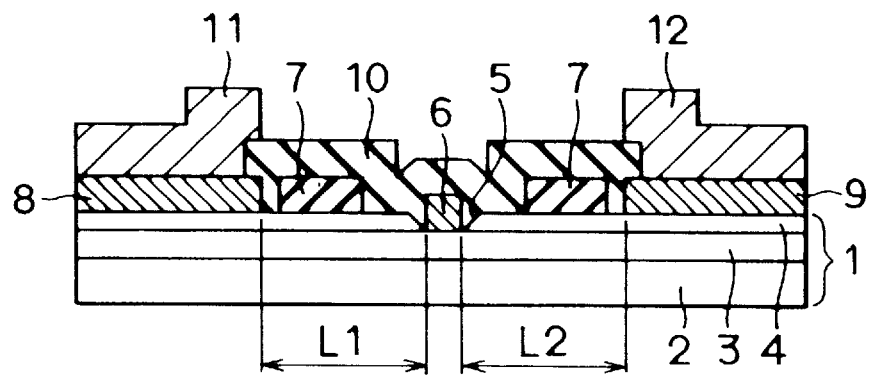

An FET having a recess gate structure according to a preferred first embodiment is shown in FIG. 20. In FIG. 20, a semiconductor substrate 1 of the FET includes a substrate 2, a Schottky contact layer 3 disposed on the substrate 2, and an ohmic contact layer 4 disposed on the Schottky contact layer 3. Each of the ohmic contact layer 4 and the Schottky contact layer 3 includes carriers. The carrier density of the Schottky contact layer 3 is lower than that of the ohmic contact layer 4.

The semiconductor substrate 1 has a recess 5 exposing the Schottky contact layer 3, and a gate electrode 6 is provided on the exposed Schottky contact layer 3 in the recess 5. An insulating layer 7 is disposed on a specific area of the ohmic contact layer 4 on an outer circumferential side of the recess 5 to sandwich the recess 5. Further, source and drain electrodes 8 and 9 are disposed on the ohmic contact layer 4 on an outer circumferential side of the insulating layer 7 to sandwich the recess 5 therebetween. Furthermore, an insulating layer 10 is formed on the gate electrode 6 and the insulating layer 7. Each of the insulating layers 7 and 10 is made of silicon oxide, silicon nitride, or the like. Further, a source wiring member 11 is disposed on the source electrode 8, and a drain wiring member 12 is disposed on the drain electrode 9.

Figure 1:
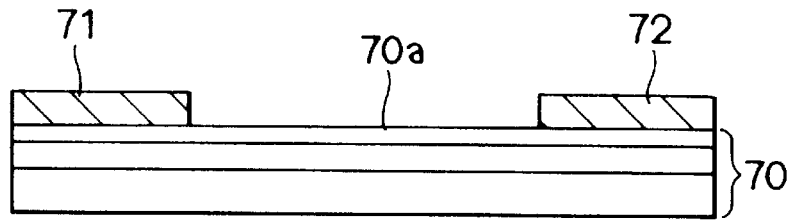
FIGS. 1 to 6 are cross-sectional views for explaining processes for producing a semiconductor device according to a prior art.
Figure 2:
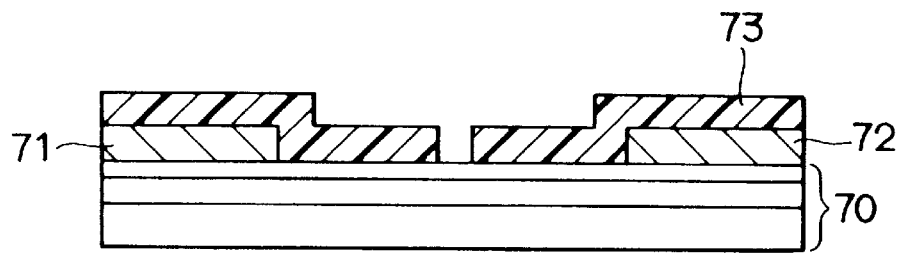
Figure 3:
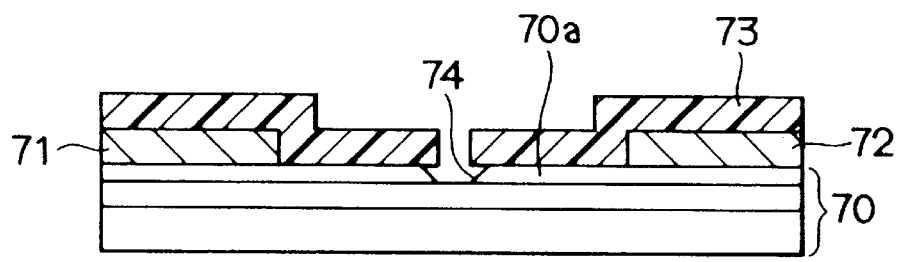
Figure 4:
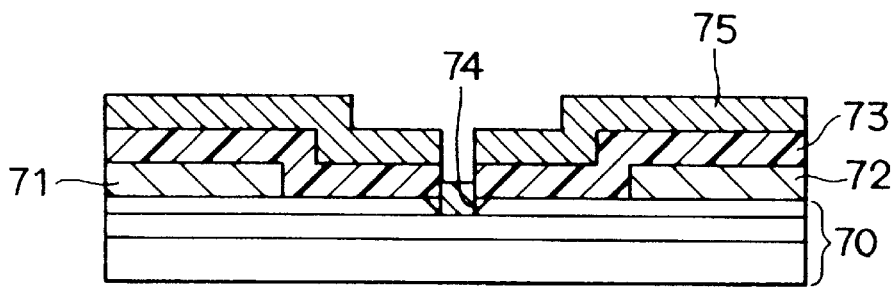
Figure 5:
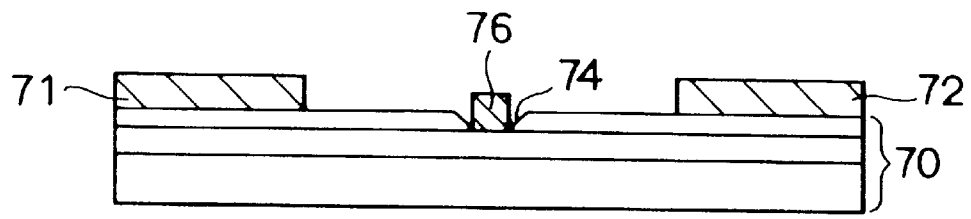
Figure 6:
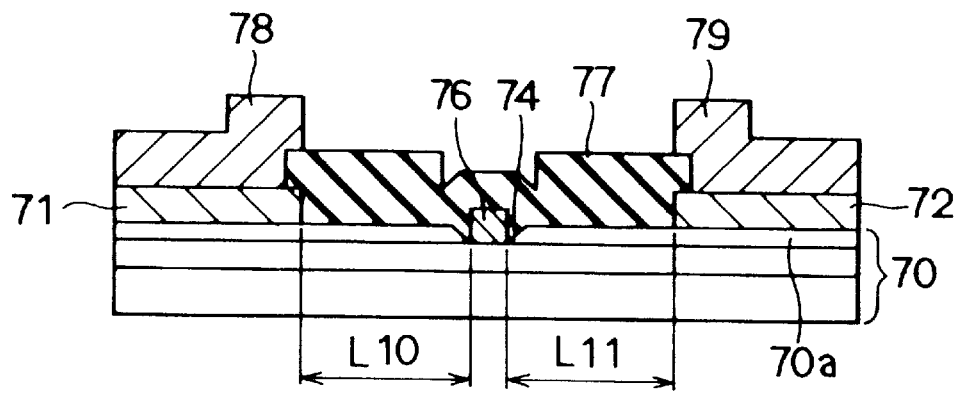
Figure 7:
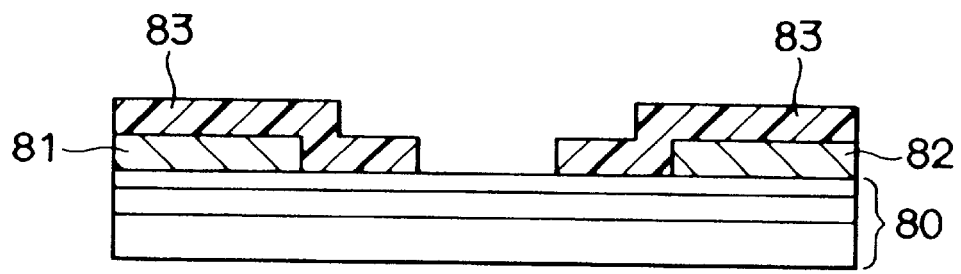
FIGS. 7 to 13 are cross-sectional views for explaining processes for producing a semiconductor device according to another prior art.
Figure 8:
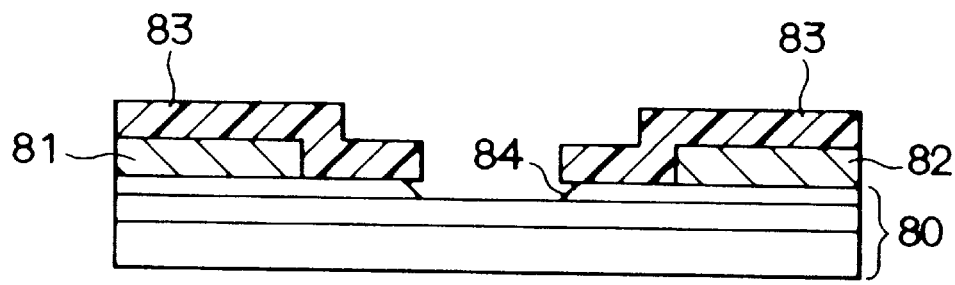
Figure 9:
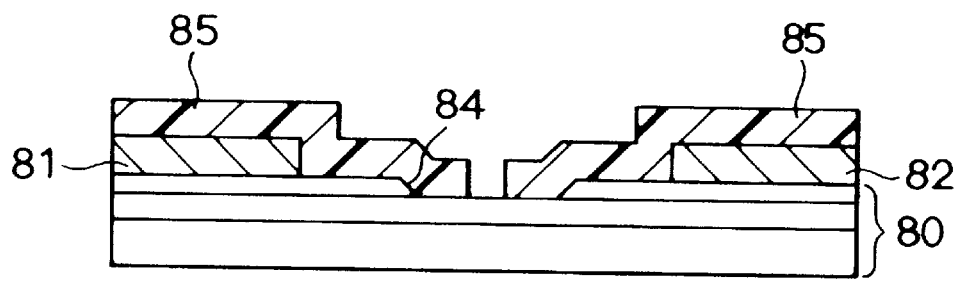
Figure 10:
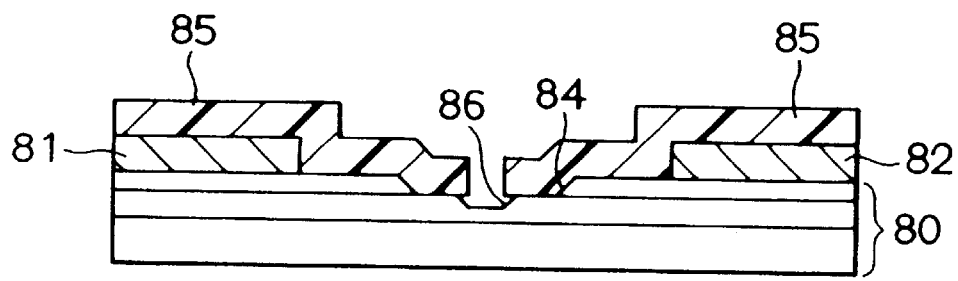
Figure 11:
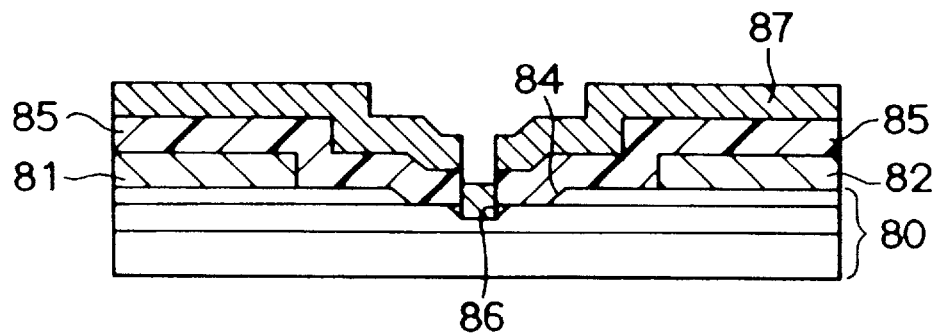
Figure 12:
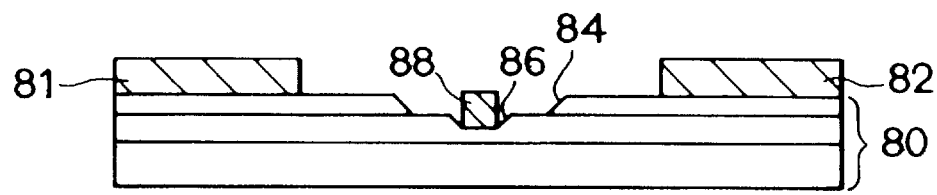
Figure 13:
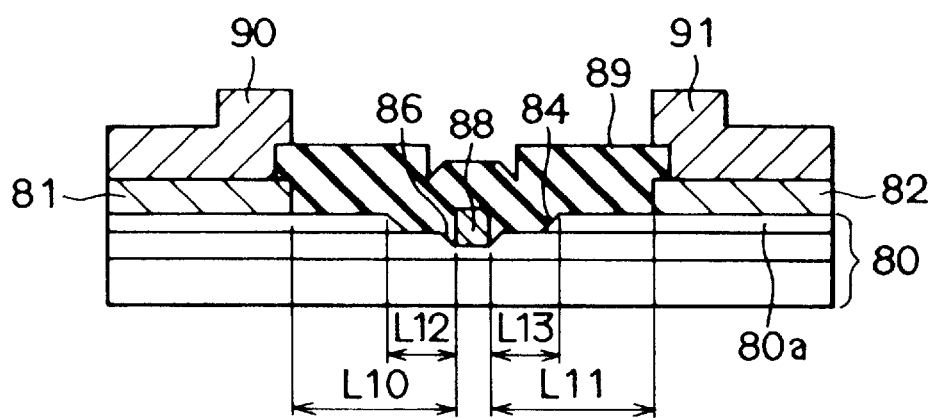
Figure 14:
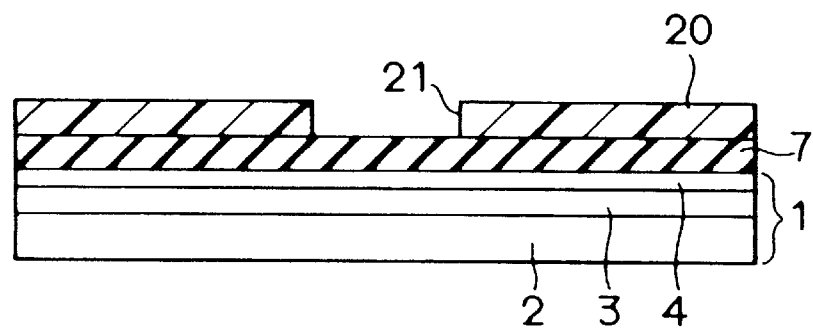
FIGS. 14 to 20 are cross-sectional views for explaining processes for producing a semiconductor device in a first preferred embodiment of the present invention.

Next, a method for manufacturing the FET shown in FIG. 20 will be explained referring to FIGS. 14 to 20. Firstly, the semiconductor substrate 1 composed of the substrate 2, the Schottky contact layer 3, and the ohmic contact layer 4 is prepared. Then, as shown in FIG. 14, the insulating layer 7 is formed on the semiconductor substrate 1 by a plasma enhanced CVD method or the like. Further, after coating a first resist layer 20 on the insulating layer 7, a resist opening portion 21 is formed in the first resist layer 20 by a photo process including an alignment step with respect to a specific pattern.

Figure 15:
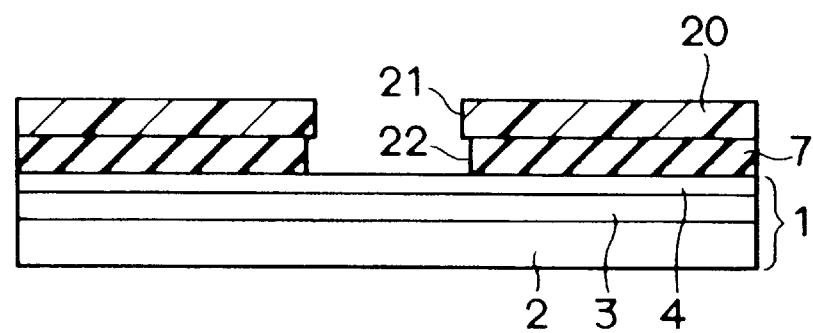

Subsequently, as shown in FIG. 15, the insulating layer 7 is etched through the resist opening portion 21 by a wet etching method using a hydrofluoric acid based aqueous solution or by a dry etching method such as a reactive ion etching (RIE) method. At that time, the resist layer 20 serves as a mask. Accordingly, a first opening portion 22 is formed in the insulating layer 7 so that the semiconductor substrate 1 is exposed from the first opening portion 22.

Figure 16:
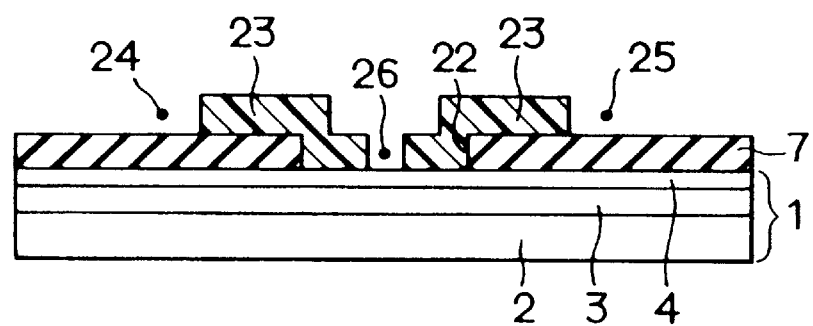

After the resist layer 20 is removed, a second resist layer 23 is coated on the semiconductor substrate 1 and on the insulating layer 7. Then, opening portions 24, 25, and 26 are formed in the second resist layer 23 as shown in FIG. 16 by a photo process including an alignment step performed with respect to a pattern of the insulating layer 7 formed by etching. The opening portions 24 and 25 are formed where the source and drain electrodes 8 and 9 are to be formed, thereby exposing the insulating layer 7 therefrom. The opening portion 26 is formed in the first opening portion 22 of the insulating layer 7 to expose the ohmic contact layer 4 therefrom.

Figure 17:
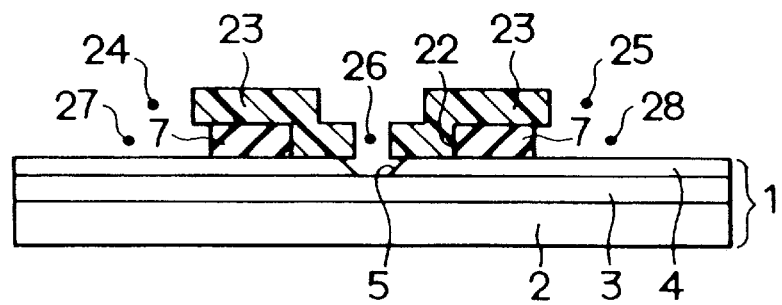

Subsequently, the ohmic contact layer 4 of the semiconductor substrate 1 exposed from the opening portion 26 is etched by a wet etching method using an aqueous solution including citric acid and hydrogen peroxide, so that the recess 5 shown in FIG. 17 is formed. In this etching process, the second resist layer 23 serves as a mask. At that time, because the insulating layer 7 remains on the ohmic contact layer 4 in the opening portions 24 and 25, the ohmic contact layer 4 underlying the insulating layer 7 is not etched in the opening portions 24 and 25. After forming the recess 5, the insulating layer 7 exposed from the opening portions 24 and 25 is removed by the wet etching method using a hydrofluoric acid based aqueous solution or the like. As a result, second opening portions 27 and 28 are formed in the insulating layer 7 to expose the semiconductor substrate 1 therefrom as shown in FIG. 17.

Figure 18:
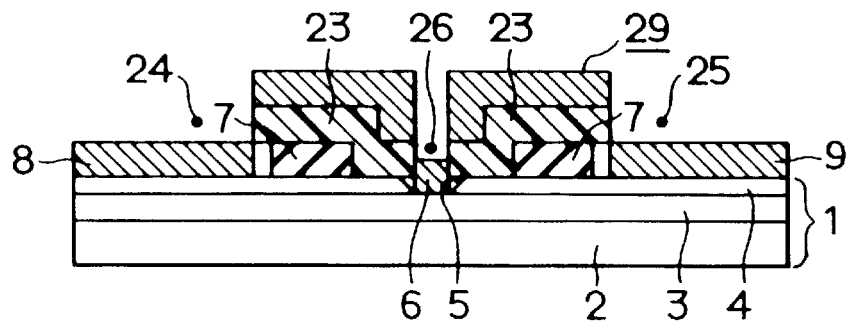

Next, as shown in FIG. 18, an electrode member 29 including Ti/Pt/Au layers or the like is deposited on the semiconductor substrate 1 by a vacuum evaporation method or the like. Accordingly, the gate electrode 6 is provided in the opening portion 26, i.e., in the recess 5, and the source and drain electrodes 8 and 9 are respectively provided in the opening portions 24 and 25. Specifically, the source and drain electrodes 8 and 9 are directly disposed on the ohmic contact layer 4 having a high carrier density to make an ohmic contact with the ohmic contact layer 4. The gate electrode 6 is directly disposed on the Schottky contact layer 3 having a low carrier density to make a Schottky contact with the Schottky contact layer 3.

Figure 19:
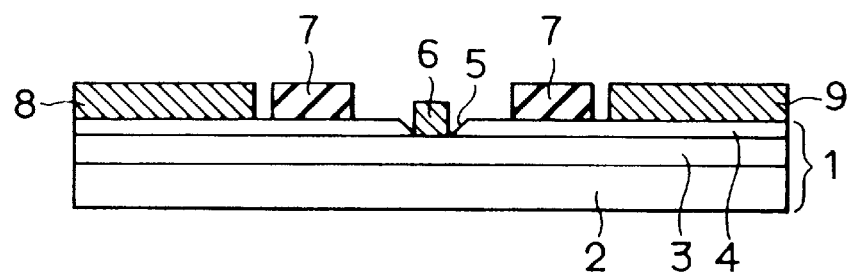

Then, the second resist layer 23 is resolved by an organic solvent or the like to be removed together with the electrode member 29 remaining on the second resist layer 23. Consequently, a state shown in FIG. 19 is obtained. Further, as shown in FIG. 20, the second insulating layer 10 is formed on the semiconductor substrate 1 by the plasma enhanced CVD method or the like. Then, contact holes exposing the source and drain electrodes 8 and 9 are formed in the insulating layer 10. Further, the source and drain wiring members 11 and 12 made of gold (Au) or the like are formed in the contact holes by an electrolytic plating method or the like, thereby completing the FET shown in FIG. 20.

According to the above-mentioned method for manufacturing the FET including the recess structure, the gate, source and drain electrodes 7, 8, and 9 can be formed at the same time by using the same mask without performing a mask alignment step. Therefore, variations in interval L1 between the gate and source electrodes 6 and 8 and variations in interval L2 between the gate and drain electrodes 6 and 9 shown in FIG. 20 can be significantly reduced. In addition, the processes for forming the FET can be simplified compared to prior arts.

Further, before the electrode member 29 is formed as shown in FIG. 18, a surface oxidized layer of the Schottky contact layer 3 exposed from the recess 5 can be removed by the etching process for the insulating layer 7 or by an after-treatment of the etching process. The hydrofluoric acid based aqueous solution or the like can be used for etching the surface oxidized layer of the Schottky contact layer 3. Accordingly, the electrode member 29 can be formed on the Schottky contact layer 3 without interposing the surface oxidized layer of the Schottky contact layer 3 therebetween. As a result, satisfactory Schottky characteristics between the gate electrode 6 and the Schottky contact layer 3 can be obtained.

(Second Embodiment)

Figure 27:
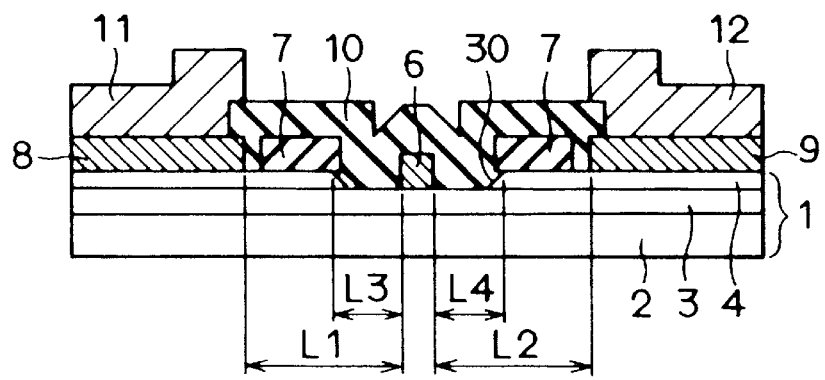

Next, a second preferred embodiment will be explained focusing on differences with respect to the first embodiment. The parts similar to those in the first embodiment are shown by the same reference numerals and detail descriptions thereof will be omitted. FIG. 27 shows an FET in the second embodiment. The FET has a recess (first recess) 30, and a gate electrode 6 is formed on a part of a bottom face of the recess 30. By adopting this structure, the FET in the second embodiment can have a large drain withstand voltage compared to that in the first embodiment.

Figure 21:
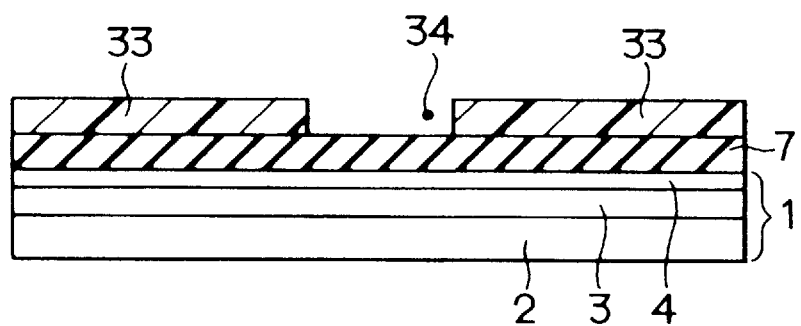
FIGS. 21 to 27 are cross-sectional views for explaining processes for producing a semiconductor device in a second preferred embodiment of the present invention.

Processes for manufacturing the FET will be explained referring to FIGS. 21 to 27. Firstly, as shown in FIG. 21, an insulating layer 7 made of silicon oxide, silicon nitride, or the like is deposited on a semiconductor substrate 1 by a plasma enhanced CVD method or the like. As in the first embodiment, the semiconductor substrate 1 is composed of a substrate 2, and a Schottky contact layer 3 and an ohmic contact layer 4 formed on the substrate 2 in this order. Then, a first resist layer 33 is coated on the insulating layer 7, and a first resist opening portion 34 is formed in the first resist layer 33 by a photo process including an alignment step with respect to a specific pattern.

Figure 22:
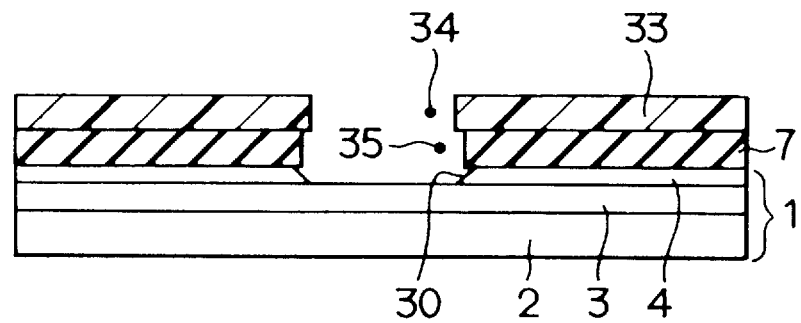

Next, the insulating layer 7 is etched through the first resist opening portion 34 by a wet etching method using a hydrofluoric acid based aqueous solution or by a dry etching method such as an RIE method, thereby forming a first opening portion 35 in the insulating layer 7. In the etching process, the resist layer 33 serves as a mask. When the RIE method is employed for the etching process, a mixture gas including methane ($CF_4$) can be used. Further, the ohmic contact layer 4 exposed from the first opening portion 35 is removed by a wet etching process using an aqueous solution including citric acid and hydrogen peroxide, or by the dry etching process such as the RIE process, thereby forming the recess 30 in the substrate 1 as shown in FIG. 22. By performing the etching process, the exposed ohmic contact layer 4 can be completely etched, so that the Schottky contact layer 3 can be sufficiently exposed in the recess 30.

Figure 23:
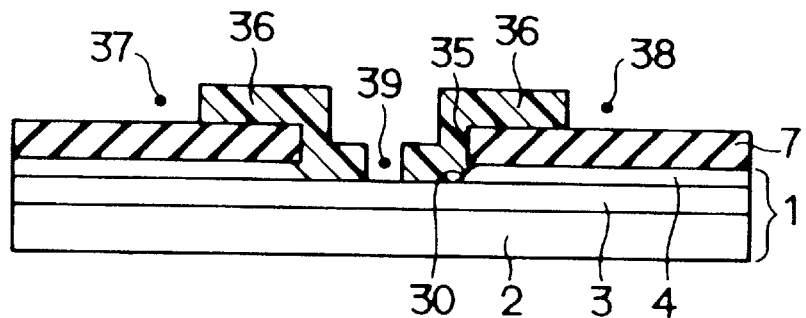

Successively, after the first resist layer 33 is removed, a second resist layer 36 is coated. Then, second resist opening portions 37, 38, and 39 are formed in the second resist layer 36 by a photo process including an alignment step with respect to a pattern of the insulating layer 7 formed by etching, i.e, with respect to etched steps of the insulating layer 7. As a result, a state shown in FIG. 23 is obtained.

In this state, the resist opening portion 39 is defined on a part of the bottom face of the recess 30 where the gate electrode 6 is to be formed, and exposes the Schottky contact layer 3 therefrom. The resist opening portions 37 and 38 are formed where the source and drain electrodes 8 and 9 are to be formed, and expose the insulating layer 7 therefrom. That is, the resist opening portions 37 and 38 are formed on both sides of the first opening portion 35 of the insulating layer 7.

Figure 24:
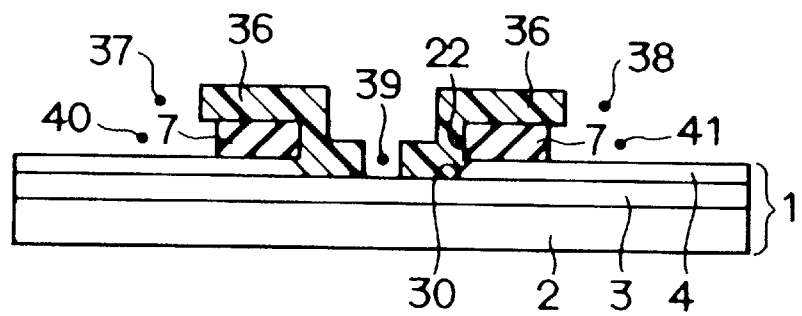

Subsequently, as shown in FIG. 24, the insulating layer 7 exposed from the resist opening portions 37 and 38 is removed by a wet etching method using the hydrofluoric acid based aqueous solution or the like. Accordingly, second opening portions 40 and 41 are formed in the insulating layer 7 to expose the ohmic contact layer 4 therethrough. Simultaneously, a surface oxidized layer of the Schottky contact layer 3 exposed from the resist opening portion 39 is removed by this etching process. A surface oxidized layer exposed from the opening portions 40 and 41 can be removed as well.

Figure 25:
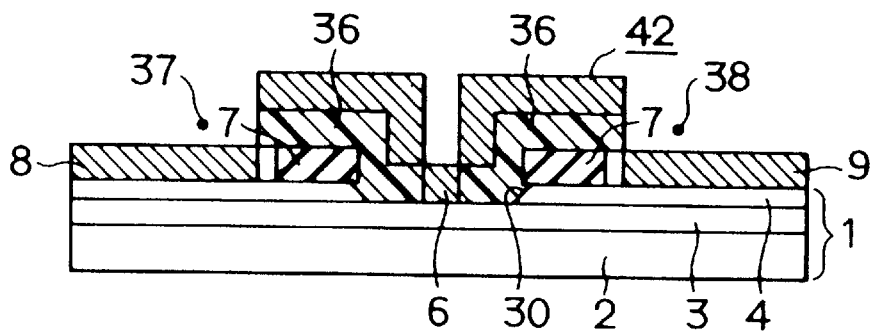

Then, an electrode member 42 including Ti/Pt/Au layers or the like is deposited by a vacuum evaporation method or the like as shown in FIG. 25. As a result, the gate electrode 6 is formed in the resist opening portion 39, and at the same time, the source and drain electrodes 6 and 8 are respectively formed in the resist opening portions 37 and 38. Specifically, the source and drain electrodes 8 and 9 directly contact the ohmic contact layer 4 having a high carrier density to exhibit ohmic contact characteristics, while the gate electrode 6 directly contacts the Schottky contact layer 3 having a low carrier density to exhibit Schottky contact characteristics.

Figure 26:
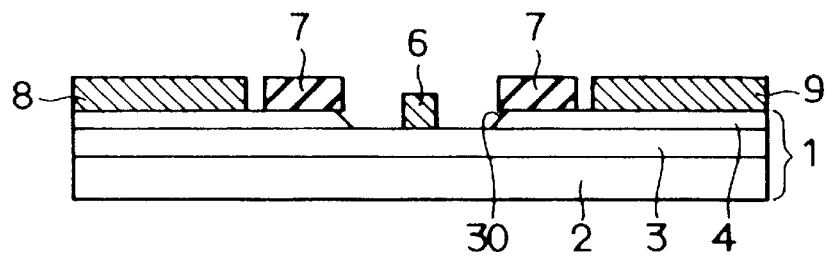

Successively, the second resist layer 36 is resolved by an organic solvent or the like to be removed together with the electrode member 42 remaining on the second resist layer 36. Consequently, a state shown in FIG. 26 is obtained. Further, as shown in FIG. 27, a second insulating layer 10 made of silicon nitride or the like is formed on the semiconductor substrate 1 by the plasma enhanced CVD method or the like. Then, contact holes are formed in the insulating layer 10 to expose the source and drain electrodes 8 and 9 therefrom. Further, source and drain wiring members 11 and 12 made of Au or the like are formed in the contact holes by an electrolytic plating method or the like.

According to the above-mentioned processes for forming the FET in the second embodiment, alignment of the opening portion 39 (the gate electrode 6) of the second resist layer 36 is performed with respect to an etched pattern of the insulating layer 7 that is formed when forming the recess 30. Therefore, even if a depth of the recess 30 is too shallow to be detected or a thickness of the second resist layer 36 is too thick to detect the recess 30 through the second resist layer 36, variations in intervals L3 and L4 (see FIG. 27) between the gate electrode 6 and end portions of the recess 30 are determined only by variations in one alignment step. As a result, the variations in the intervals L3 and L4 can be decreased by approximately a half of that of a prior art described above referring to FIGS. 7 to 13.

In addition, according to this embodiment, the gate, source, and drain electrodes 6, 8, and 9 can be formed at the same time with the same mask without performing a mask alignment step. Therefore, variations in intervals L1 and L2 (see FIG. 27) between the gate and source electrodes 6 and 8, and between the gate and drain electrodes 6 and 9 can be significantly reduced. As a result, variations in high frequency parameter caused by variations in source resistance of the FET, variations in drain withstand voltage, and the like can be reduced.

In the second embodiment, when the insulating layer 7 is etched as shown in FIG. 24, the surface oxidized layer of the Schottky contact layer 3 is also removed. However, the surface oxidized layer of the Schottky contact layer 3 may be removed by an after-treatment of the etching process of the insulating layer 7 before the electrode member 42 is deposited. Accordingly, the gate electrode 6 and the Schottky contact layer 3 can exhibit satisfactory Schottky contact characteristics. The other features and effects are the same as those in the first embodiment.

(Third Embodiment)

Figure 31:
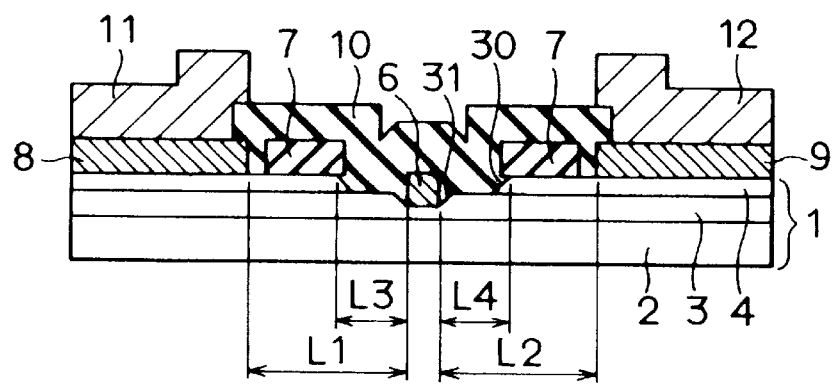

Next, a third preferred embodiment will be explained focusing on differences with respect to the second embodiment. The parts similar to those in the second embodiment are shown by the same reference numerals and detail descriptions thereof will be omitted. FIG. 31 shows an FET having a double recess structure in the third embodiment. The FET has a first recess (secondary recess) 30 and a second recess (main recess) 31 formed on a bottom face of the first recess 30 where a gate electrode 6 is to be formed.

Since processes until second resist opening portions 37, 38, and 39 are formed may be the same as those described in the second embodiment referring to FIGS. 21 to 23, corresponding figures and explanations will be omitted in the third embodiment. The recess 30 in the second embodiment is referred to as the first recess 30 in the third embodiment. In FIG. 23, there are some cases that the Schottky contact layer 3 is not sufficiently exposed only by forming the recess 30. Therefore, the third embodiment is characterized in that the semiconductor substrate 1 is further etched through the second resist opening portion 39 by a wet etching process or the like to form the second recess 31.

Figure 28:
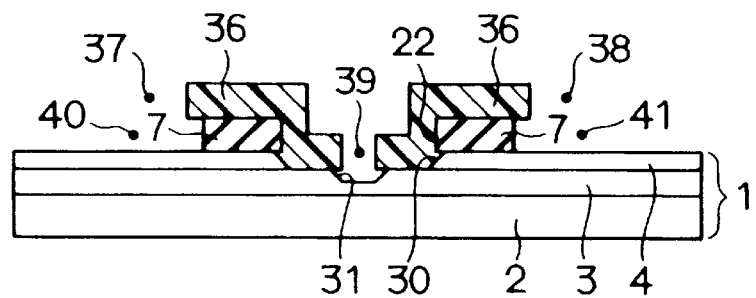
FIGS. 28 to 31 are cross-sectional views for explaining processes for producing a semiconductor device in a third preferred embodiment of the present invention.

Then, subsequent processes will be explained in detail referring to FIGS. 28 to 31. As mentioned above, the semiconductor substrate 1 is further etched through the opening portion 39. In this etching process, the second resist layer 36 serves as a mask again. An aqueous solution including citric acid and hydrogen peroxide can be used as an etching solution. Accordingly, the second recess 31 shown in FIG. 28 is formed in the semiconductor substrate 1. By performing the second recess etching process, the Schottky contact layer 3 can be sufficiently exposed from the second resist opening portion 39. In this state, because the insulating layer 7 remains on the semiconductor substrate 1 in the second resist opening portions 37 and 38, the semiconductor substrate 1 in the second resist opening portions 37 and 38 is not etched during the second recess etching process.

Then, after forming the second recess 31, the insulating layer 7 exposed from the second resist opening portions 37 and 38 is removed by the wet etching process using the hydrofluoric acid based aqueous solution or the like. Accordingly, the second opening portions 40 and 41 are formed in the insulating layer 7 to expose the semiconductor substrate 1 therefrom as shown in FIG. 28.

Figure 29:
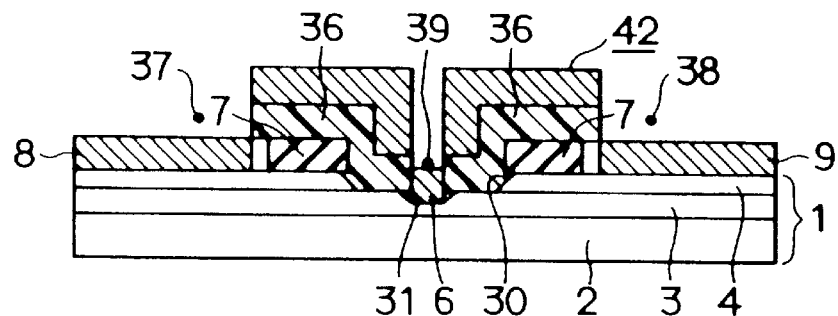
Figure 30:
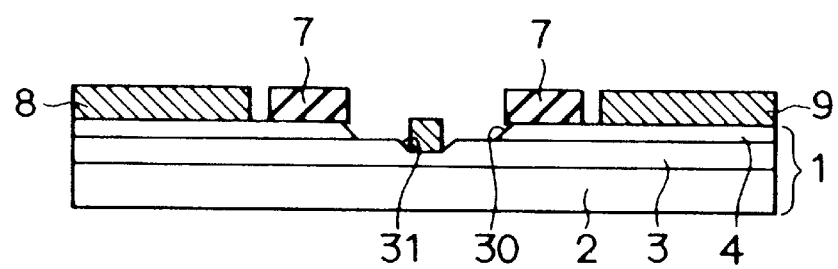

Next, as shown in FIG. 29, the electrode member 42 including Ti/Pt/Au layers or the like is deposited by the vacuum evaporation method or the like. Accordingly, the gate electrode 6 is disposed in the resist opening portion 39, while the source and drain electrodes 8 and 9 are respectively disposed in the resist opening portions 37 and 38. Successively, the second resist layer 36 is resolved by an organic solvent or the like, so that the second resist layer 36 is removed along with the electrode member 42 disposed on the second resist layer 36 by a lift-off method, thereby obtaining a state shown in FIG. 30.

Further, as mentioned in the first and second embodiments, after forming the second insulating layer 10 by the plasma enhanced CVD method or the like, contact holes for the source and drain electrodes 8 and 9 are formed. Then, the source and drain wiring members 11 and 12 made of Au or the like are formed on the source and drain electrodes 8, 9 as shown in FIG. 31.

In the third embodiment, although the first and second recesses 30 and 31 are formed in the semiconductor substrate 1, variations in intervals L3 and L4 (see FIG. 31) between the gate electrode 6 and end portions of the first recess 30 are determined only by variations in one alignment step as in the second embodiment. This is because the opening portion 39 and the second recess 31 are successively formed by etching processes using the same mask (second resist layer 36). The one alignment step is performed with respect to an etched pattern of the insulating layer 7 to form the opening portion 39 in the second resist layer 36 (see FIG. 23). As a result, the variations in intervals L3 and L4 can be decreased by approximately a half of that of the prior art described above referring to FIGS. 7 to 13.

In addition, according to the third embodiment, because the second recess 31 is formed in the Schottky contact layer 3 after forming the first recess 30, the Schottky contact layer 3 can be more sufficiently exposed through the opening portion 39. As a result, the gate electrode 6 can have more ideal Schottky contact characteristics. The other features and effects are the same as those in the second embodiment.

(Fourth Embodiment)

Figure 32:
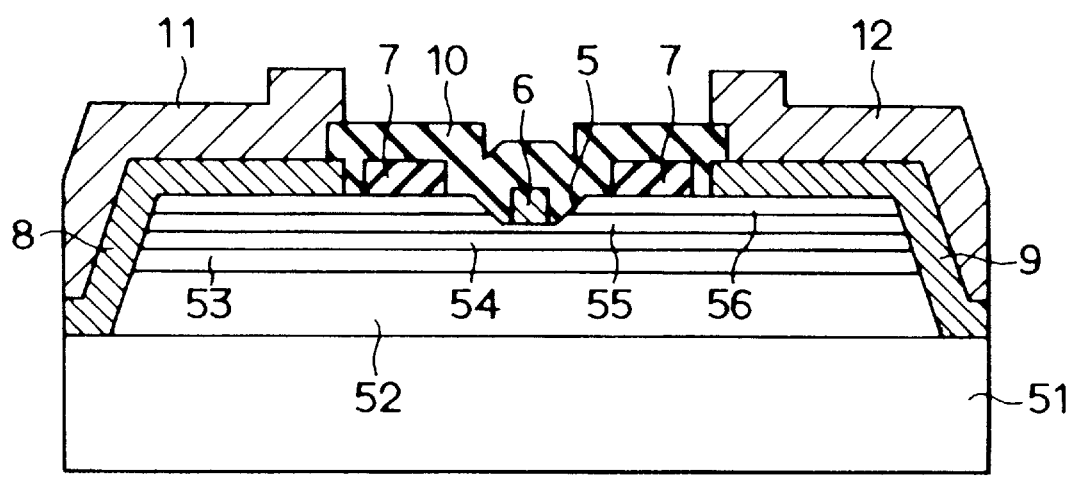
FIG. 32 is a cross-sectional view showing a semiconductor device in a fourth preferred embodiment of the present invention.

Next, a fourth preferred embodiment of the present invention will be explained focusing on differences with respect to the first embodiment. A semiconductor device having a recess structure in the fourth embodiment is shown in FIG. 32. The parts similar to those in the first embodiment are shown by the same reference numerals and detail descriptions thereof will not be reiterated. The semiconductor device in FIG. 32 adopts a HEMT substrate in place of the semiconductor substrate 1 in the first embodiment. The HEMT substrate has a semi-insulating substrate 51, and a buffer layer 52, a channel layer 53, a doped layer 54, a Schottky contact layer 55, and an ohmic contact layer 56 that are epitaxially grown on the semi-insulating substrate 51 in this order by a MBE method, a MOCVD method, or the like.

Carriers are produced in the doped layer 54 that is doped with impurities. Then, the carriers are accumulated in the channel layer 53 that is not doped with any impurities and move in the channel layer 53. Therefore, the carriers can move in the channel layer 53 without being adversely affected by diffusion of the impurities and the like, so that the HEMT substrate has a high mobility.

Since processes for forming the HEMT shown in FIG. 32 may be substantially the same as those described in the first embodiment referring to FIGS. 14 to 20, corresponding detail descriptions will not be reiterated. Here, it should be noted that a recess (main recess) 5 is formed in the ohmic contact layer 56 to sufficiently expose the Schottky contact layer 55 therefrom. As shown in FIG. 32, the recess 5 may be formed not only in the ohmic contact layer 56 but in the Schottky contact layer 55 to same extent. Accordingly, the gate electrode 6 can sufficiently contact the Schottky contact layer 55.

The semi-insulating substrate 51 of the HEMT substrate may be, for example, a semi-insulating InP substrate. In this case, the other layers are preferably made of the following materials. That is, the buffer layer 52 is made of non-doped InAlAs, and the channel layer 53 is made of non-doped InGaAs. The doped layer 54 is composed of laminated layers of a non-doped InAlAs layer and an InAlAs layer doped with Si at approximately $1 \times 10^{19}$ cm$^3$. Further, the Schottky contact layer 55 is made of non-doped InAlAs and the ohmic contact layer 56 is made of InGaAs doped with Si at approximately $1 \times 10^{19}$ cm$^3$. In this structure, it is not always necessary to employ the InAlAs layer doped with Si for the doped layer 54, and alternatively, a planar-doping structure of Si may be employed.

In the above-mentioned HEMT substrate, the ohmic contact layer 56 is made of InGaAs doped with Si at a high concentration. Therefore, source and drain electrodes 8 and 9 can have satisfactory ohmic contact characteristics with respect to the HEMT substrate without being subject to a heat treatment. The source, drain, and gate electrodes 8, 9, and 6 respectively include Ti/Pt/Au layers as in the first embodiment. The other features and effects are substantially the same as those in the first embodiment.

(Fifth Embodiment)

Figure 33:
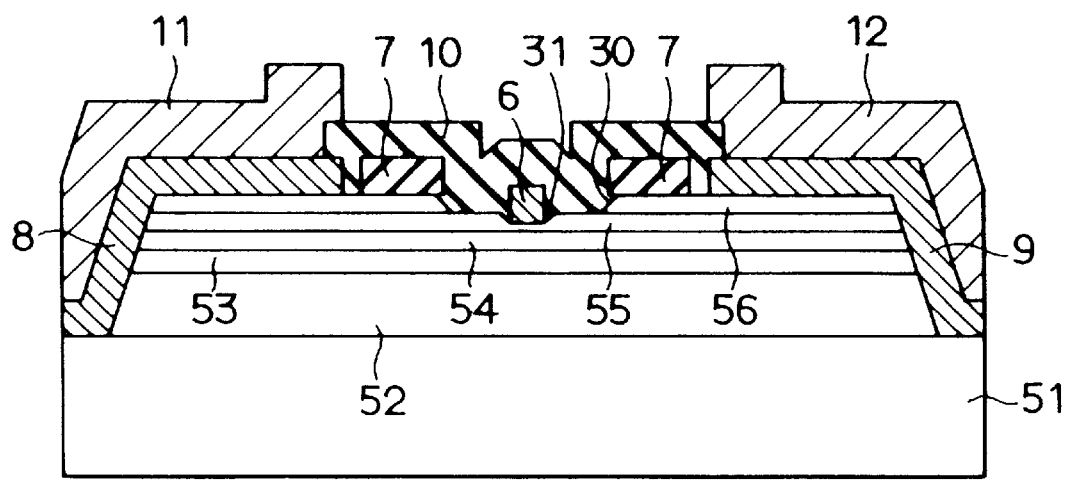
FIG. 33 is a cross-sectional view showing a semiconductor device in a fifth preferred embodiment of the present invention.

Next, a fifth preferred embodiment of the present invention will be explained focusing on differences with respect to the third and fourth embodiment. FIG. 33 shows a semiconductor device having a double recess structure in the fifth embodiment. The parts similar to those in the third and fourth embodiments are shown by the same reference numerals and detail descriptions thereof will not be reiterated. The semiconductor device in the fifth embodiment adopts a HEMT substrate in place of the semiconductor substrate 1 in the third embodiment. The other features are similar to those in the third embodiment. The HEMT substrate has substantially the same structure as that of the fourth embodiment.

In more detail, when the first recess 30 is formed in the ohmic contact layer 56, there are cases that the ohmic contact layer 56 is completely etched to expose the Schottky contact layer 55 through the first recess and that the ohmic contact layer 56 partially or entirely remains in the first recess 30. In the case that the ohmic contact layer 56 remains in the first recess 30, by forming the second recess 31, the gate electrode 6 can contact the Schottky contact layer 55 more completely. In addition, by forming the first and second recesses 30 and 31, a drain withstand voltage of the HEMT in the fifth embodiment can be increased. The other effects are substantially the same as those in the third and fourth embodiments.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A method for producing a semiconductor device, comprising:

preparing a semiconductor substrate on which an insulating layer is disposed;

forming a first resist layer on the insulating layer;

etching the insulating layer through the first resist layer through the first resist layer to have a specific pattern;

etching the semiconductor substrate through the specific pattern to form a recess in the semiconductor substrate;

removing the first resist layer;

forming a second resist layer on the insulating layer and in the recess to have first, second, and third resist opening portions, the first resist opening portion exposing the semiconductor substrate in the recess where a gate electrode is to be formed, the second and the third resist opening portions exposing the insulating layer where source and drain electrodes are to be formed;

removing the insulating layer in the second and third resist opening portions; and forming the gate, source, and drain electrodes in the first, second, and third resist opening portions to contact the semiconductor substrate.

2. The method of claim 1, wherein the gate electrode is formed on the semiconductor substrate to make a Schottky contact with the semiconductor substrate, and the source and drain electrodes are formed on the semiconductor substrate to make an ohmic contact with the semiconductor substrate.

3. The method of claim 1, wherein the gate, source, and drain electrodes are formed on the semiconductor substrate at the same time.

4. The method of claim 3, wherein:

after removing the insulating layer in the second and third resist opening portions, an electrode member for the gate, source, and drain electrodes is formed on the semiconductor substrate and on the second resist layer; and the electrode member on the second resist layer is removed together with the second resist layer.

5. The method of claim 1, further including removing a surface oxidized layer of the semiconductor substrate exposed form the first, second, and third resist opening portions before forming the gate, source, and drain electrodes.

6. The method of claim 1, including aligning the first, second, and third resist opening portions of the second resist layer with respect to the specific pattern of the insulating layer holding the second resist layer thereon.

7. The method of claim 1, further including:

forming another recess in the semiconductor substrate through the first resist opening portion before removing the insulating layer in the second and third resist opening portions, wherein forming the gate electrode includes forming the gate electrodes in formed in said another recess.

8. A method for producing a semiconductor device, comprising:

preparing a semiconductor substrate including a Schottky contact layer having a first carrier density and an ohmic contact layer formed on the Schottky contact layer and having a second carrier density larger than the first carrier density;

disposing an insulating layer having a specific pattern including a first opening portion on the semiconductor substrate;

forming a recess in the semiconductor substrate through the first opening portion to expose the Schottky contact layer through the recess;

disposing a resist layer on the ohmic contact layer through the insulating layer interposed therebetween and on the Shottky contact layer directly in the recess, the resist layer having a resist opening portion through which the Schottky contact layer is exposed in the recess;

forming second and third opening portions in the insulating layer to expose the ohmic contact layer through the second and third opening portions; and forming a gate electrode on the Schottky contact layer in the resist opening portion, and simultaneously forming drain and source electrodes on the ohmic contact layer in the second and third opening portions.

9. The method of claim 8, further including a step of forming another recess in the recess to sufficiently expose the Schottky contact layer before forming the gate electrode, wherein the gate electrode is formed in the another recess.

10. The method of claim 1, further comprising:

determining positions of the first, second, and third resist opening portions with respect to the specific pattern of the insulating layer before forming the first, second, and third resist opening portions.

11. The method of claim 1, wherein:

forming the specific pattern of the insulating layer includes forming an insulating layer opening portion through which the recess is formed; and forming said recess with an edge portion approximately corresponding to an edge portion of the insulating layer opening portion.

12. The method of claim 1, wherein preparing the semiconductor substrate includes:

forming a first semiconductor layer with a first carrier density and a second semiconductor layer disposed on the first semiconductor layer with a second carrier density different from the first carrier density;

forming the recess in the second semiconductor layer to expose the first semiconductor layer; and forming the second resist layer in direct contact with the first semiconductor layer in the recess.

13. The method of claim 1, wherein forming the second resist layer includes:

forming a single layer directly disposed on the insulating layer; and forming the first resist opening portion with a width smaller than that of the recess, the width of the first resist opening portion determines a width of the gate electrode.

14. The method of claim 8, wherein forming the recess includes forming the recess with an edge portion approximately corresponding to an edge portion of the first opening portion of the specific pattern of the insulating layer.

15. The method of claim 8, wherein disposing the resist layer includes:

disposing the resist layer on the ohmic contact layer through the insulating layer and on the Shottky layer directly in the recess;

determining a position of the resist opening portion with respect to the specific pattern of the insulating layer; and forming the resist opening portion in the resist layer at the position.

16. The method of claim 15, further comprising forming the second and third opening portions in the insulating layer through the resist layer after aligning positions of the second and third opening portions with respect to the specific pattern along with the resist opening portion.

17. The method of claim 8, including forming said resist layer with a single layer and forming said resist opening portion with a width which is approximately uniform in a thickness direction of the resist layer to determine a width of the gate electrode.

18. A method for producing a semiconductor device, comprising:

preparing a semiconductor substrate including a first semiconductor layer having a first carrier density, a second semiconductor layer disposed on the first semiconductor layer and having a second carrier density different from the first carrier density, and an insulating layer disposed on the second semiconductor layer;

patterning the insulating layer into a specific pattern, the specific pattern including a first opening portion, forming a recess in the semiconductor substrate through the first opening portion to expose the first semiconductor layer;

disposing a resist layer at least in the recess to directly contact the first semiconductor layer;

forming a resist opening portion at a gate position in the resist layer after aligning the gate position with respect to the specific pattern of the insulating layer, the resist opening portion exposing the first semiconductor layer in the recess; and forming a gate electrode in the resist opening portion at the gate position.

19. The method of claim 17, further comprising:

forming second and third opening portions in the insulating layer to expose the second semiconductor layer, before forming the gate electrode; and forming source and drain electrodes in the second and third opening portions when the gate electrode is formed.

* * * * *